United States Patent [19]

Ishii et al.

[11] Patent Number: 5,389,873
[45] Date of Patent: Feb. 14, 1995

[54] PRESSURE CONTACT CHIP AND WAFER TESTING DEVICE

[75] Inventors: Tatsuya Ishii; Masatoshi Matsumoto, both of Itami, Japan

[73] Assignee: Mitsubishi Denki Kabushiki Kaisha, Tokyo, Japan

[21] Appl. No.: 62,538

[22] Filed: May 18, 1993

[30] Foreign Application Priority Data

Jun. 5, 1992 [JP] Japan ................... 4-145459

[51] Int. Cl.$^6$ .............................................. G01R 1/04
[52] U.S. Cl. .................... 324/158.1; 324/754
[58] Field of Search .................. 324/158 F, 158 P; 439/116

[56] References Cited

U.S. PATENT DOCUMENTS 4,065,717 12/1977 Kattner et al. ................ 324/158 P
5,065,103 11/1991 Slinkman ...................... 324/458

OTHER PUBLICATIONS

IEEE/IRPS, J. Mitsuhashi, et al., 1987, "Effect of P-Sin Passivation Layer on Time-Dependent Dielectric Breakdown in SiO2", pp. 60–65.

*Primary Examiner*—Kenneth A. Wieder
*Assistant Examiner*—Barry C. Bowser
*Attorney, Agent, or Firm*—Oblon, Spivak, McClelland, Maier & Neustadt

[57] ABSTRACT

In order to enable a burn-in test in a wafer state even if a semiconductor wafer has a number of bonding pads on every chip, bumps (15) are brought into contact with bonding pads (5c) of all chips (5b) provided on a semiconductor wafer (5), so that voltages are simultaneously applied to all chips. The bumps (15) are arranged on a translucent polyimide film (10) in mirror image relation to the bonding pads (5c), so that the former are aligned with the latter with alignment marks (34a, 34b) through an opening (11a) and the polyimide film (10) with a light-optic microscope (13). A heater (14) is brought into dose contact with the back surface of the semiconductor wafer (5), to heat the same. Thus, potential defective chips can be screened before assembling steps, to reduce the cost. Failure analysis can be quickly performed with excellent maintenance on a process line, to improve the yield and the throughput.

25 Claims, 12 Drawing Sheets

PRESSURE CONTACT CHIP AND WAFER TESTING DEVICE

BACKGROUND OF THE INVENTION

1. Field of the Invention

The present invention relates to a method of a burn-in test, which is one of screening methods (potential defect screening methods) for semiconductor integrated circuits.

2. Description of the Background Art

Figure 10:
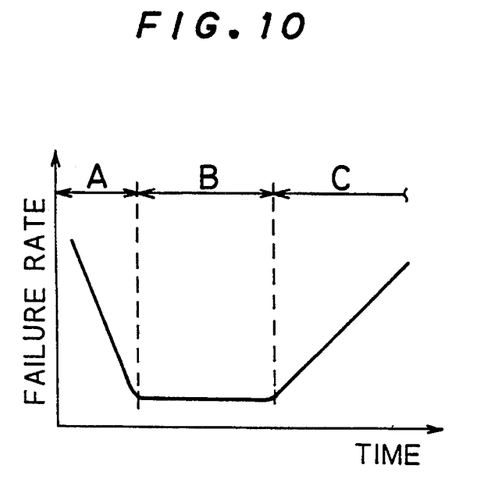
FIG. 10 is a characteristic diagram showing a failure rate curve.

FIG. 10 is a characteristic diagram illustrating a failure rate curve (bathtub curve) showing the relation between elapsed times in actual working states and failure rates as to semiconductor integrated circuits or the like.

In an initial failure period A, failures are caused by defects in manufacturing, i.e., potential defects to be removed by screening. In a chance failure period B, failures are caused by chance in normal products after screening of the potential defects, and the failure rate is stably minimized in this period. In a wear-out failure period C, normal products are wasted and deteriorated with time to increase the failure rate.

Figure 11:
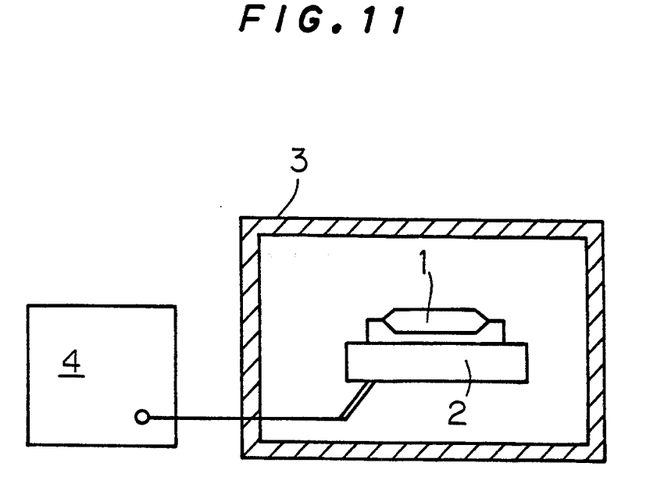
FIG. 11 is an explanatory diagram showing a conventional burn-in test.

A burn-in test is performed in order to remove products having potential defects which are caused during manufacturing steps corresponding to the initial failure period A thereby ensuring reliability of shipped products. FIG. 11 illustrates a state of such a burn-in test.

A semiconductor integrated circuit 1 which is completely assembled is set on a socket 2, and arranged in the interior of a thermostat 3 as a whole to be connected to a voltage application device 4. The voltage application device 4 applies a source voltage which is higher than that in actual working conditions to the semiconductor integrated circuit 1, while the thermostat 3 supplies an atmosphere temperature which is higher than that in the actual working conditions for performing aging. The burn-in test is made under severer conditions than the actual working conditions, in order to detect and screen initial hilures in a short time by accelerating aging. However, the thermostat 3 may supply an atmosphere temperature which is lower than that in the actual working conditions for performing aging, as the case may be.

As hereinabove described, the burn-in test, which is a screening method for a semiconductor integrated circuit, has been generally carried out on a finished product after packaging.

However, it has been recognized that potential defects related to initial failures are not caused in an assembling step but mostly caused in a wafer process. For example, a defect in an insulating film of a MIS (metal insulator semiconductor) integrated circuit represented by a VLSI (very large scale integrated circuit) is caused in the wafer process.

However, the conventional burn-in test is carried out on the semiconductor integrated circuit 1 being passed through the assembling step, as hereinabove described. Even if a potential defective chip already has a defect in a wafer process, therefore, the defect cannot be found through the burn-in test until the next assembling step is completed.

If the defect is not found until the burn-in test is carried out after the assembling step, the assembling step following the wafer process itself results in vain to deteriorate the throughput. Further, various materials employed for the assembling step are so wasted that the situation is extremely unadvantageous in cost as a whole.

Further, failure analysis and feedback to the wafer process, i.e., countermeasures such as discovery of abnormality in the process line and maintenance are inevitably retarded to cause reduction in yield. This also exerts such an unpreferable influence that the speed of development of new products is retarded.

Figure 12:
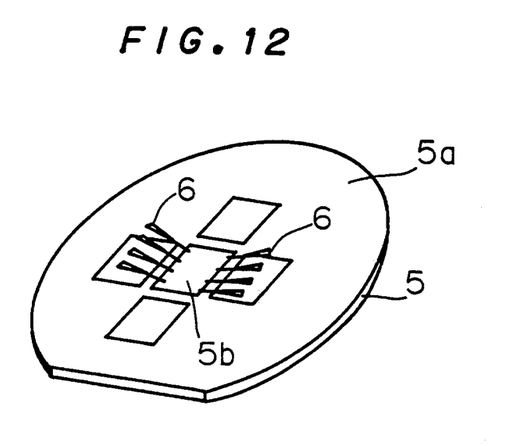
FIG. 12 is a perspective view showing a conventional wafer test.
Figure 13:
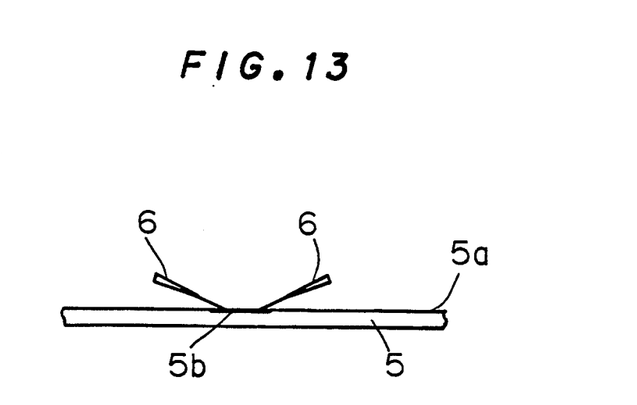
FIG. 13 is a side elevational view showing the conventional wafer test.

On the other hand, a wafer test (functional test) of performing energization in a wafer state is generally known as a test which is not a burn-in test but made after completion of a wafer process. FIG. 12 is a perspective view showing a state of such a wafer test, and FIG. 13 is aside elevational view thereof.

A chip 5b having a plurality of bonding pads is formed on a major surface 5a of a semiconductor wafer 5. Metal probers 6 are brought into contact with respective ones of these bonding pads. The "bonding pads" are connection regions of bonding wires for connecting circuit elements provided on a semiconductor wafer with external electrode terminals in an assembling step, as is well known in the art.

The wafer test is carried out by applying a voltage or a current through a certain metal prober 6 and extracting the voltage or current by another metal prober 6.

The respective ones of the plurality of metal probers 6 are brought into contact with the bonding pads of the chip 5b in inclined states. In this case, contact pressures of the metal probers 6 for the bonding pads can be easily uniformalized.

When the metal probers 6 arc thus inclined, however, only one chip 5b can be tested in a single wafer test and it is impossible to simultaneously test a plurality of such chips 5b. In the case of a burn-in test, an extremely long time is required if tens of chips 5b provided on a single wafer 5 are entirely tested one by one, since energization for tens of hours is required for testing one chip 5b. Thus, it is impractical to carry out a burn-in test while inclining the metal probers 6.

Figure 14:
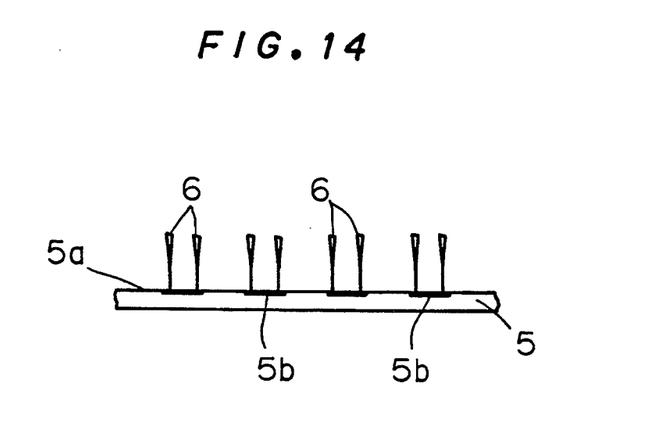
FIG. 14 is an explanatory diagram for pointing out problems.

Then, consider that the metal probers 6 are brought into contact with the bonding pads perpendicularly to the major surface 5a as shown in FIG. 14. In this case, it may be possible to simultaneously apply voltages to all chips 5b.

In recent years, however, a semiconductor integrated circuit such as a microprocessor or a gate array is so increasingly improved in scale that a single chip is provided with 100 or more bonding pads. Thus, it is physically impossible to accurately bring the metal probers 6 into contact with all bonding pads of all chips 5b provided on the semiconductor wafer 5 in perpendicular states with constant pressures.

When the metal probers 6 arc employed for carrying out screening in a wafer state similarly to the wafer test, therefore, an extremely long time is required as hereinabove described.

SUMMARY OF THE INVENTION

The present invention is directed to a testing device for a wafer and chips for testing at least one chip which is formed on one major surface of a semiconductor wafer. In a first aspect of the present invention, the testing device comprises (a) a test plate having a contact electrode which is arranged to be in mirror image relation to a prescribed one of bonding pads provided in each chip and at least partially having transparency in the direction of its thickness, (b) alignment means for recognizing the semiconductor wafer through the test plate and relatively moving said test plate with respect to the semiconductor wafer thereby making alignment, (c) compression bonding means for bringing the contact electrode into contact with the prescribed bonding pad with a uniform and constant pressure, and (d) signal application means for applying an electric signal to the chip from the contact electrode.

Preferably, the test plate comprises (a-1) a transparent substrate having the contact electrode on its surface.

Preferably, the substrate is substantially formed by a polyimide film.

Preferably, the test plate further comprises (a-2) an upper bonding plate being formed on an opposite side of the contact electrode through the substrate.

Preferably, the upper bonding plate is partially opened.

Preferably, at least a part of the upper bonding plate has transparency.

Preferably, the upper bonding plate is made of a material substantially having transparency.

Preferably, the alignment means comprises (b-1) positional relation detection means for recognizing the semiconductor wafer through the test plate thereby detecting positional relation between the test plate and the semiconductor wafer, and (b-2) moving means for relatively moving the test plate with respect to the semiconductor wafer on the basis of the positional relation.

Preferably, the semiconductor wafer has a first alignment mark, and the substrate has a second alignment mark coinciding with the first alignment mark under the part of the upper bonding plate having transparency.

Preferably, an organic film is in close contact with another major surface of the semiconductor wafer, and the testing device further comprises a lower bonding plate for receiving the organic film of the semiconductor wafer.

Preferably, the chips are separated from each other.

Preferably, the aforementioned at least one chip is single.

Preferably, the lower bonding plate comprises temperature control means on its upper major surface.

Preferably, the temperature control means is a heater.

Preferably, the testing device further comprises a thermostat for storing the test plate and the semiconductor wafer.

Preferably, the thermostat further stores the upper bonding plate and the lower bonding plate.

Preferably, the contact electrode is made of a substantially convex conductive material.

Preferably, the conductive material is a metal.

Preferably, the conductive material is prepared from an organic material containing a conductive material.

Preferably, the testing device further comprises an anisotropic conductive film having flexibility, excellent conductivity in a direction of its thickness and no conductivity in a direction perpendicular to the direction of its thickness so that the anisotropic conductive film is interposed between the contact electrode and the chip, while the contact electrode is compression-bonded to the bonding pad which is opposite thereto through the anisotropic conductive film to conduct with the bonding pad.

Preferably, the signal application means simultaneously applies a prescribed electric signal to all chips from the contact electrode.

Preferably, the prescribed electric signal is a pulse signal required for driving the chips.

Preferably, the prescribed electric signal is a dc voltage.

In the first aspect of the present invention, it is possible to recognize the semiconductor wafer through the test plate at least partially having transparency in the direction of its thickness, whereby the test plate and the semiconductor wafer can be easily aligned with each other.

In a second aspect of the present invention, a testing device for a wafer and chips for testing at least one chip which is formed on one major surface of a semiconductor wafer comprises (a) a test plate including (a-1) a substrate having (a-1-1) a contact electrode which is arranged to be in mirror image relation to a prescribed one of bonding pads provided in each chip, and (a-1-2) a through hole passing through a portion close to the contact electrode, and (a-2) a wire which is formed on a surface of the substrate which is opposite to that provided with the contact electrode to be connected to the contact electrode via the through hole, (b) alignment means for relatively moving the test plate with respect to the semiconductor wafer thereby making alignment, (c) compression bonding means for bringing the contact electrode into contact with the prescribed bonding pad with a uniform and constant pressure, and (d) signal application means for applying an electric signal to the chip from the contact electrode.

In the second aspect of the present invention, the wire is formed on the surface of the substrate which is opposite to that provided with the contact electrode to be connected with the contact electrode via the through hole, whereby it is possible to avoid contact with unnecessary bonding pads.

In a third aspect of the present invention, a testing device for a wafer and chips for testing at least one chip which is formed on one major surface of a semiconductor wafer comprises (a) a test plate having a contact electrode which is arranged to be in mirror image relation to a prescribed one of bonding pads provided in each chip, (b) alignment means for relatively moving the test plate with respect to the semiconductor wafer thereby making alignment, (c) compression bonding means including (c-1) pressurization means for pressing the test plate, (c-2) detection means for detecting a current flowing to the contact electrode, (c-3) control means for controlling force of the pressurization means pressing the test plate depending on the result of detection by the detection means, and (c-4) a lower bonding plate for receiving the semiconductor wafer, for bringing the contact electrode into contact with the prescribed bonding pad with a uniform and constant pressure, and (d) signal application means for applying an electric signal to the chip from the contact electrode.

In the third aspect of the present invention, the detection means detects the current flowing to the contact electrode so that the control means controls the force of the pressurization means pressing the test plate depending on the result of detection. Therefore, it is possible to compression-bond contact electrodes to all bonding pads of each pad with uniform contact pressures.

According to the inventive testing device for a wafer and chips, therefore, it is possible to perform a burn-in test in a wafer state after completion of a wafer process in advance of an assembling step. In other words, it is possible to find potential defective chips in a stage before the assembling step to remove the same by screening, whereby the cost can be reduced in consideration of steps and materials as compared with the case of assembling the potential defective chips. Further, the speed of failure analysis is increased with an increased speed of feedback to the wafer process, whereby maintenance in the process line can be improved to attain improvement in yield and throughput. Further, it is possible to exert a good influence on increase in speed of development of new products.

Accordingly, an object of the present invention is to enable a burn-in test to be carried out in a short time in a wafer state even if a single chip is provided with a number of bonding pads.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A. Structure

Figure 1:
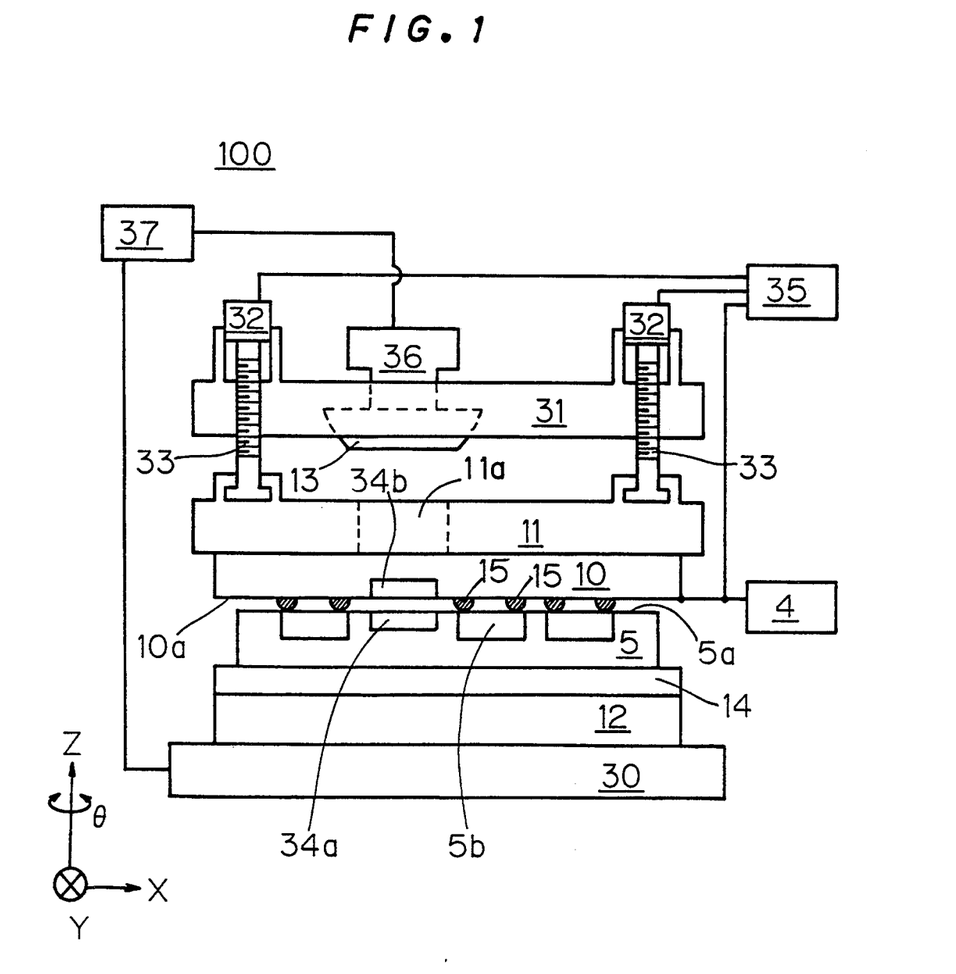
FIG. 1 is a block diagram showing a first embodiment of the present invention.

FIG. 1 is a block diagram schematically showing a testing device 100 for a wafer and chips according to a first embodiment of the present invention.

A lower bonding plate 12 is placed on an X-Y-$\theta$ stage 30, so that these elements are rotatable along a direction $\theta$ about X- and Y-axes which are perpendicular to each other in a horizontal plane and a Z-axis which is perpendicular to these axes. A heater 14 is provided on the lower bonding plate 12, to heat a semiconductor wafer 5 which is placed thereon. Chips 5b are formed on a major surface 5a of the semiconductor wafer 5, while a plurality of bonding pads (not shown) are formed on each chip 5b.

A motor control unit 35 drives wafer bonding motors 32, which in turn rotate wafer bonding screws 33. Thus, an upper bonding plate 11 is delivered from a wafer bonding fixed plate 31 in parallel with the Z-axis, to compression-bond a substrate, defined by a polyimide film 10, which is provided on its lower surface to the major surface 5a of the semiconductor wafer 5. In more concrete terms, the bonding pads provided on the chips 5b and bumps 15 provided on a lower surface 10a of the polyimide film 10 are compression-bonded to each other.

The semiconductor wafer 5 is provided on its major surface 5a with an alignment mark 34a independently of the chips 5b. This alignment mark 34a is formed by a cross mark, for example.

In correspondence to the alignment mark 34a, the substrate 10 is provided on its lower surface 10a with an alignment mark 34b independently of the bumps 15. This alignment mark 34b substantially coincides with the alignment mark 34a, for aligning the substrate 10 and the semiconductor wafer 5 with each other.

The upper bonding plate 11 is provided with an opening 11a in a portion above the alignment mark 34b, while the wafer bonding fixed plate 31 is provided with a light-optic microscope 13 and a camera 36.

An image processing and stage control unit 37 controls movement of the X-Y-$\theta$ stage 30 and operation of the camera 36.

The motor control unit 35 for controlling compression bonding strength in the Z-axis direction is connected to the bumps 15 with a voltage application device 4.

B. Alignment

First, each bump 15 must be aligned with each chip 5b, more exactly each bonding pad. The lower surface 10a of the polyimide film 10 is first placed in parallel with the major surface 5a of the semiconductor wafer 5 with a spacing by a prescribed distance. The bumps 15 provided on the polyimide film 10 are formed in coordinates exactly position-corresponding to the bonding pads provided on the major surface 5a of the semiconductor wafer 5. In other words, the bumps 15 are formed in mirror image relation to the bonding pads.

The polyimide film 10 is translucent, and transmits light. Therefore, the camera 36 can recognize misalignment of the alignment marks 34a and 34b through the light-optic microscope 13 and the opening 11a. An output signal from the camera 36 is converted to a correction signal by the image processing and stage control unit 37. In accordance with this correction signal, the X-Y-$\theta$ stage 30 is so moved that the alignment mark 34a coincides with the alignment mark 34b.

C. Uniform Compression Bonding

Figure 2:
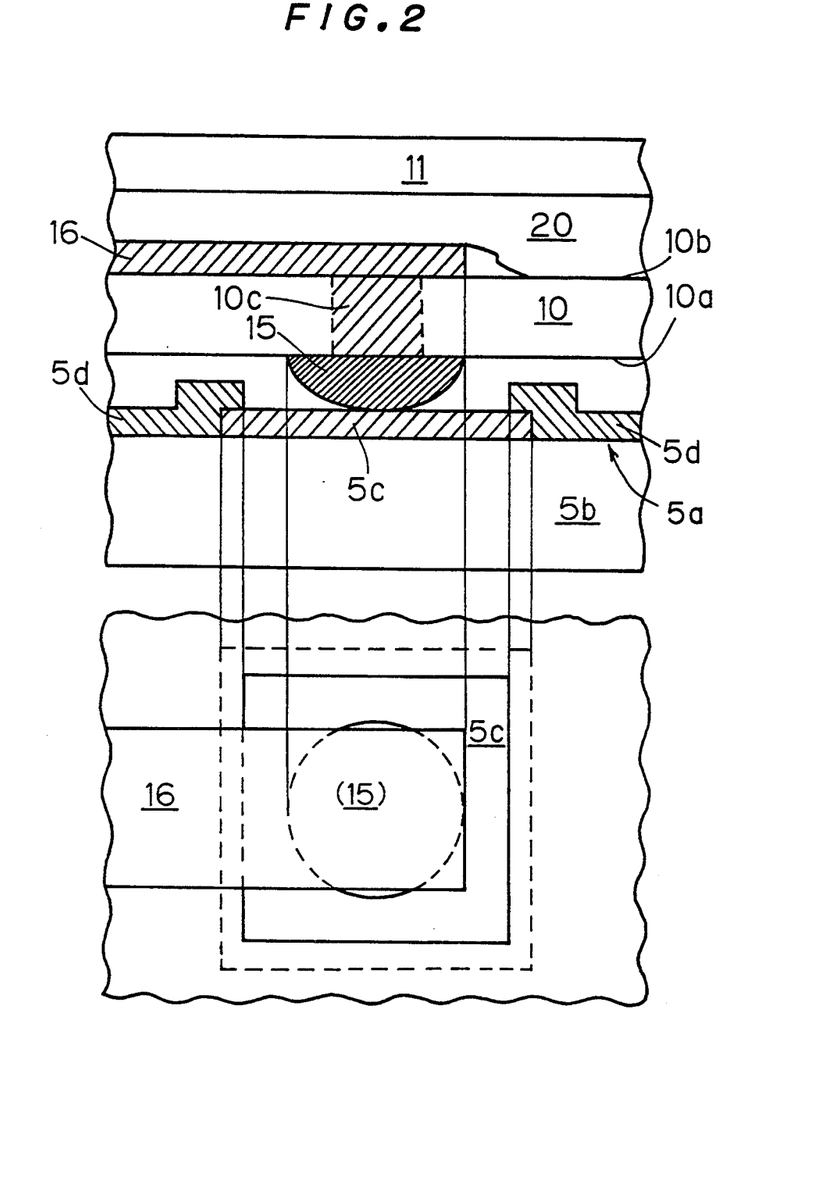
FIG. 2 shows enlarged sectional and plan views illustrating a portion around a surface of a chip 5b in the first embodiment.

FIG. 2 shows enlarged sectional and plan views illustrating a portion around one chip 5b of the semiconductor wafer 5. A passivation film 5d covers each of the chips 5b provided on the major surface 5a of the semiconductor wafer 5, and is opened in a portion provided with each bonding pad 5c.

A corresponding one of the bumps 15 is compression-bonded to the bonding pad 5c by the upper bonding plate 11. This bump 15 is connected to a wire 16, which is formed on an upper surface 10b of the polyimide film 10, via a through hole 10c. Therefore, it is possible to apply a voltage externally from the voltage application device 4 to the bonding pad 5c through the wire 16, the through hole 10c and the bump 15. On the other hand, it is possible to detect a current flowing in the bonding pad 5c through the bonding pad 5c, the bump 15, the through hole 10c and the wire 16.

The motor control unit 35 can detect this current to control driving of the wafer bonding motors 32 and adjust the compression bonding strength on the basis of the result, thereby compression-bonding the bump 15 to the bonding pad 5c with a uniform contact pressure.

Each of the wafer bonding motors 32, which are provided in four, for example, can feed back the current from the chip 5b provided in a region corresponding thereto for adjusting the compression bonding strength.

Thus, the bumps 15 are employed as energizers for the bonding pads 5c so that the same can be brought into contact with all bonding pads 5c of the plurality of chips 5b with uniform contact pressures in uniform adhesion to the major surface 5a of the semiconductor wafer 5 as compared with the metal probers 6 employed in the conventional wafer test while coping with increase in the degree of integration.

D. Prevention of Malfunction

The wire 16 is formed on the upper surface 10b of the polyimide film 10 which is opposite to the lower surface 10a provided with the bumps 15, whereby the same can be prevented from contact with unnecessary ones of the bonding pads 5c. Even if the degree of integration of the chips 5b is increased to require increase in degree of integration of the bumps 15, therefore, it is possible to prevent a malfunction with reliable operation.

When the upper bonding plate 11 is made of a conductive material, however, unpreferable conduction may be caused on the upper surface 10b. As shown in FIG. 2, therefore, a rubber member 20 is preferably provided on a region of the upper bonding plate 11 provided with no opening 11a for serving as an insulator and a cushion.

E. Burn-In Test

When the alignment marks 34a and 34b are aligned with each other and the bumps 15 are compression-bonded to the bonding pads 5c with uniform contact pressures, the chips 5b are subjected to a burn-in test.

Referring to FIG. 1, it is possible to make an acceleration test since the chips 5b can be heated by the heater 14.

The voltage application device 4 applies a pulse signal required for driving the chip (dynamic burn-in test) or adc voltage (static burn-in) to each bonding pad 5c through each bump 15, to carry out the burn-in test.

While the voltage application device 4 can supply the signal to all chips 5b provided on the semiconductor wafer 5, the chips 5b may be divided into some groups so that a signal is supplied to each group.

Second Embodiment

Figure 3:
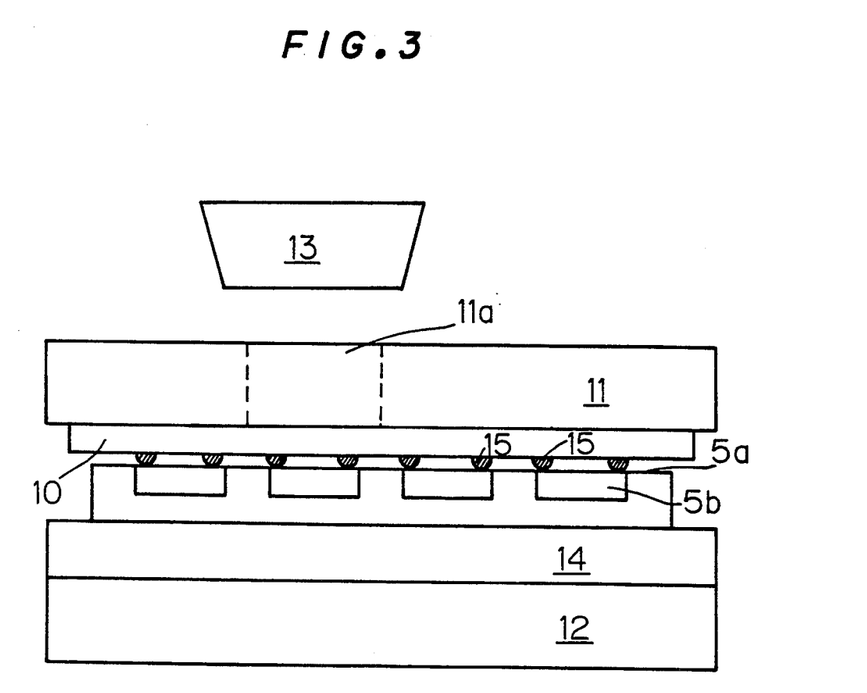
FIG. 3 is a block diagram showing a portion around a semiconductor wafer 5 in a second embodiment.

FIG. 3 is a block diagram showing a portion around a semiconductor wafer 5, for illustrating a second embodiment of the present invention. For the purpose of simplification, mechanisms for alignment and compression bonding are omitted in relation to the structure shown in FIG. 1.

In the second embodiment, alignment marks 34a and 34b are not necessarily required since a light-optic microscope 13 can detect misalignment of bonding pads 5c and bumps 15 through an opening 11a.

Third Embodiment

Figure 4:
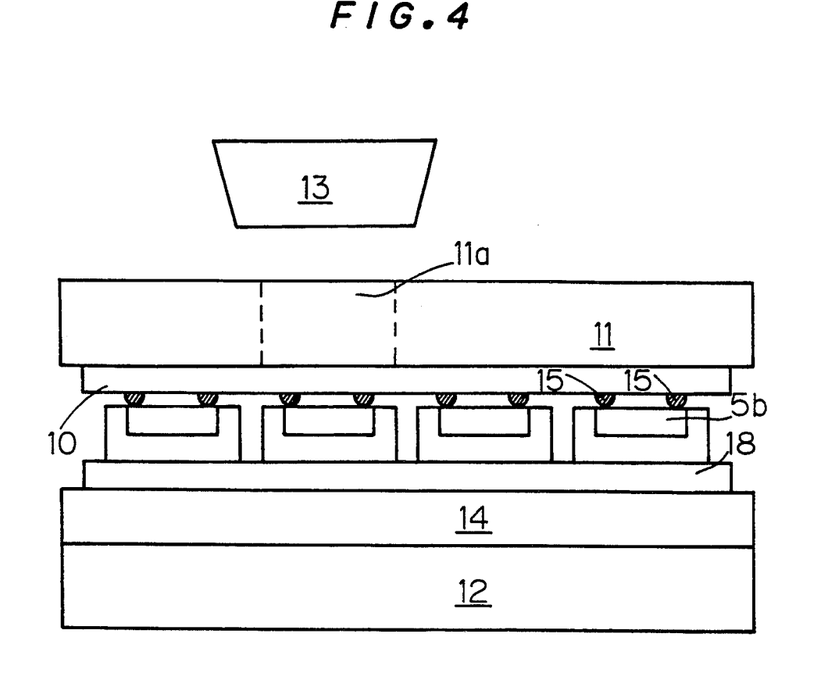
FIG. 4 is a block diagram showing a portion around a semiconductor wafer 5 in a third embodiment.

FIG. 4 is a block diagram showing a portion around a semiconductor wafer 5 for illustrating a third embodiment of the present invention. For the purpose of simplification, mechanisms for alignment and compression bonding are omitted in relation to the structure shown in FIG. 1.

The third embodiment is also applicable to a semiconductor wafer 5 which is scribed to separate chips 5b from each other. A vinyl member 18 is brought into close contact with the back surface of the semiconductor wafer 5 which is completely passed through a wafer process, so that a burn-in test is carried out on the chips 5b which are fixed to the vinyl member 18.

Figure 5:
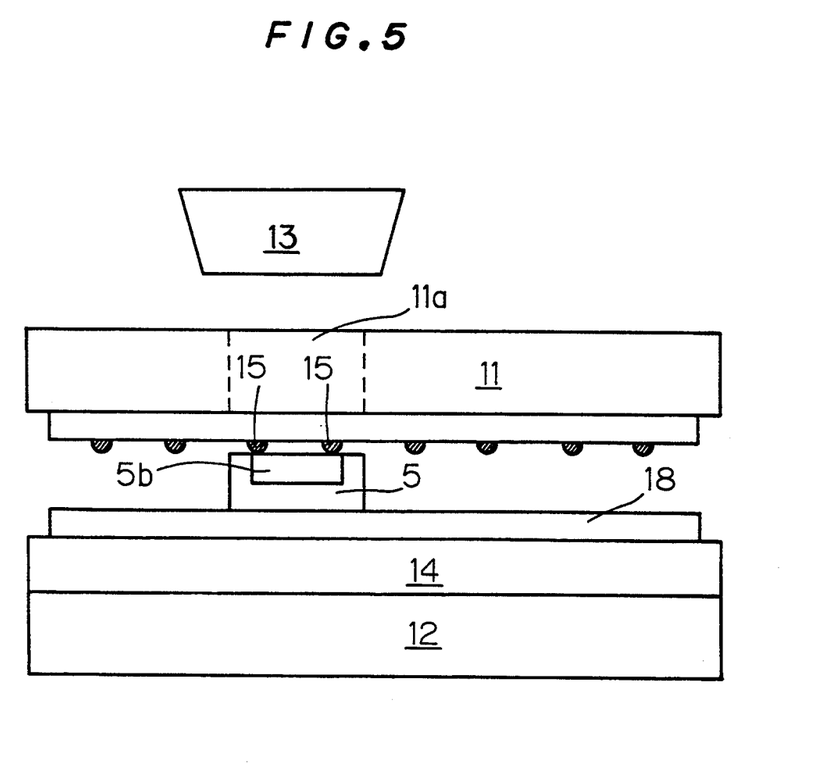
FIG. 5 is a block diagram showing the portion around the semiconductor wafer 5 in the third embodiment.

Even if the semiconductor wafer 5 has only one chip 5b, the chip 5b can be properly aligned with and compression-bonded to the bumps 15 provided under the opening 11a since the same is fixed to the vinyl member 18, as shown in FIG. 5.

Fourth Embodiment

Figure 6:
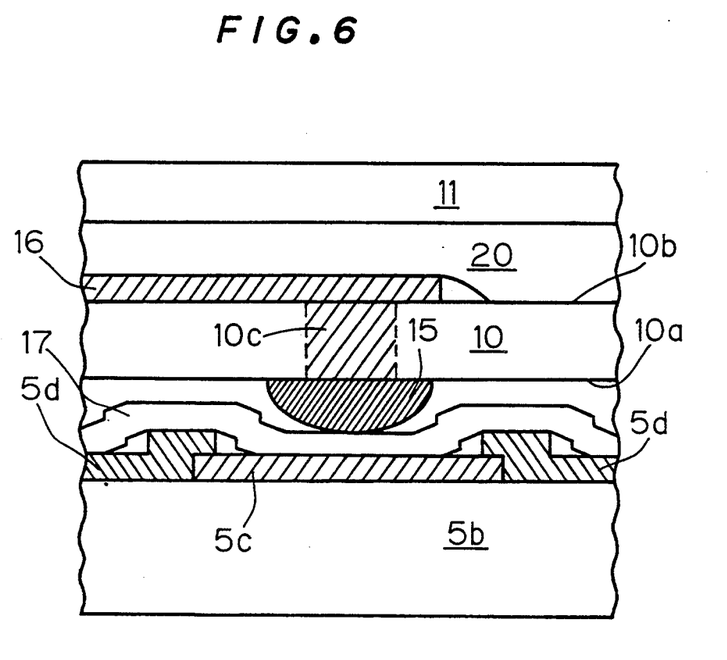
FIG. 6 is an enlarged sectional view showing a portion around a major surface 5a of a semiconductor wafer 5 in a fourth embodiment.

FIG. 6 is a block diagram showing a portion around a semiconductor wafer 5 for illustrating a fourth embodiment of the present invention. For the purpose of simplification, mechanisms for alignment and compression bonding are omitted in relation to the structure shown in FIG. 1.

According to the fourth embodiment, each bump 15 is compression-bonded to each bonding pad 5c through an anisotropic conductive film 17, in order to reduce mechanical damage to the bonding pad 5c. The anisotropic conductive film 17 has flexibility, excellent conductivity in a direction of its thickness, and no conductivity in a direction perpendicular to the direction of its thickness. Therefore, the bump 15 excellently conducts with the bonding pad 5c, and causes no unpreferable shorting with another bump 15.

Figure 7:
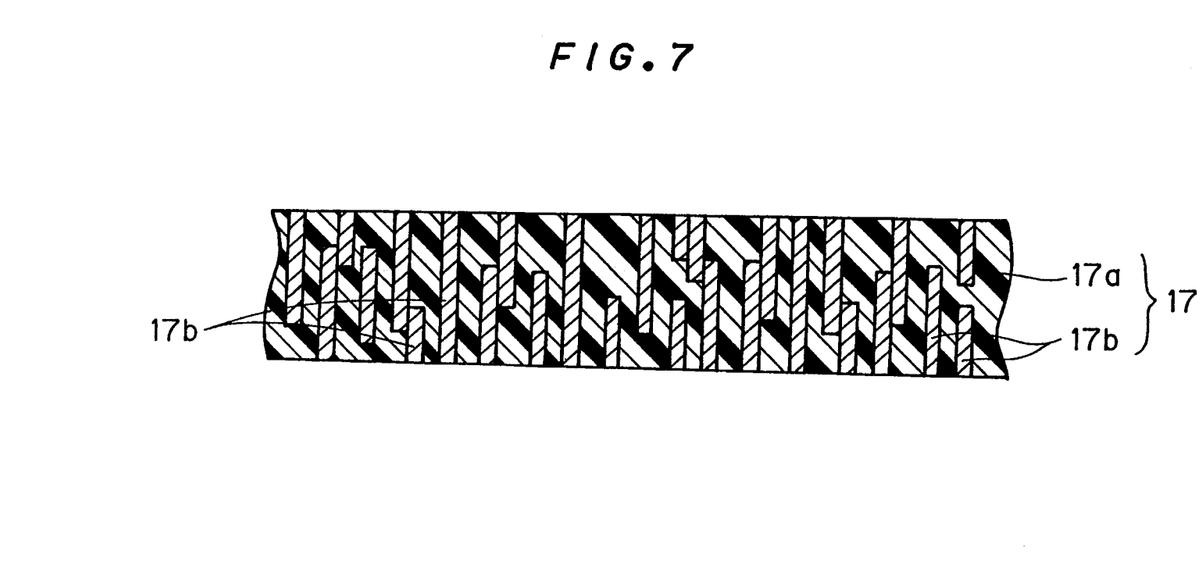
FIG. 7 is a sectional view showing an anisotropic conductive film 17.

FIG. 7 is a sectional view showing a known structure of the anisotropic conductive film 17, which is formed by embedding an extremely large number of conductive fiber members 17b in a silicone rubber member 17a, which is an insulating material serving as a base material, in a state oriented in the direction of the thickness.

In order to reduce mechanical damage to the bonding pad 5c, the bump 15 may be prepared from a convex member which is made of an organic material containing a conductive material.

Fifth Embodiment

Figure 8:
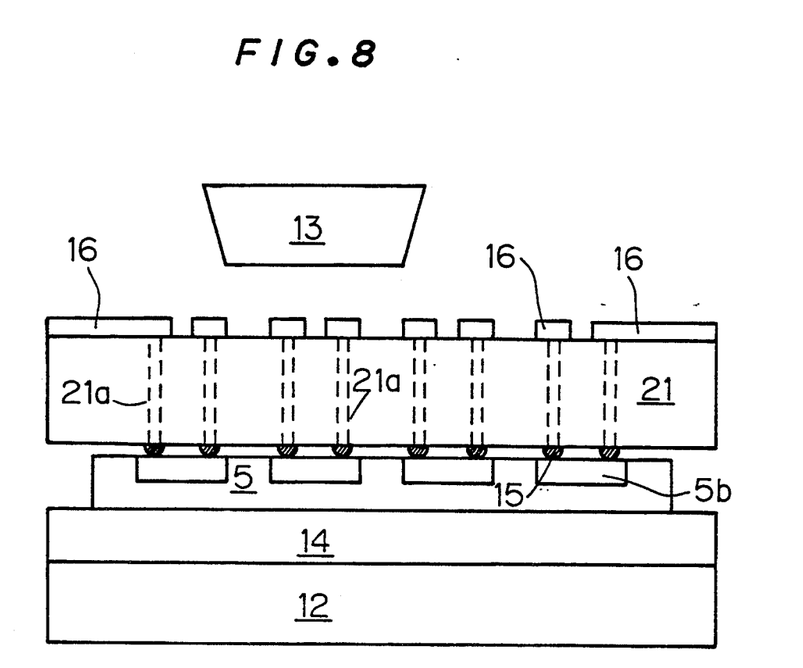
FIG. 8 is a block diagram showing a portion around a semiconductor wafer 5 in a fifth embodiment.

FIG. 8 is a block diagram showing a portion around a semiconductor wafer 5 for illustrating a fifth embodiment of the present invention. For the purpose of simplification, mechanisms for alignment and compression bonding are omitted in relation to the structure shown in FIG. 1.

According to the fifth embodiment, a glass upper bonding plate 21 having a through hole 21a is employed in place of the upper bonding plate 11 and the polyimide film 10. Bumps 15 and wires 16 are formed on upper and lower surfaces of the glass upper bonding plate 21 respectively, to be connected with each other via through holes 21a.

Since the glass upper bonding plate 21 is transparent, the bumps 15 can be aligned with chips 5b through no opening for alignment.

Sixth Embodiment

Figure 9:
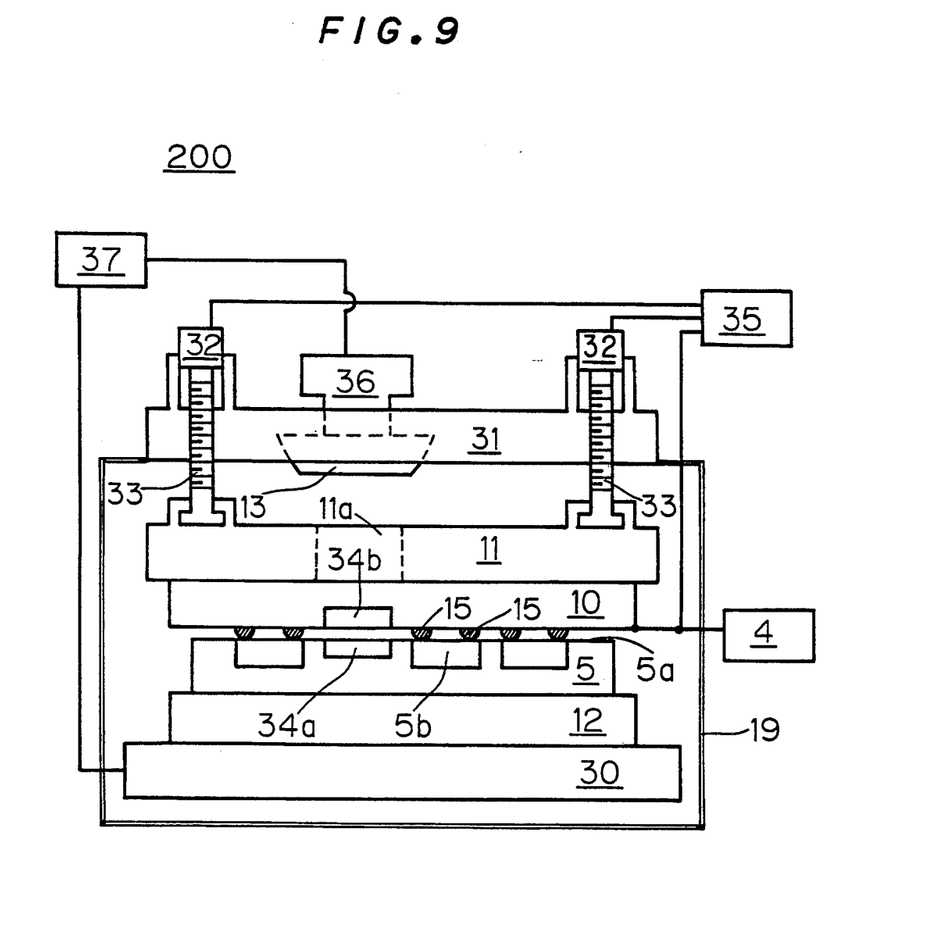
FIG. 9 is a block diagram showing a sixth embodiment of the present invention.

FIG. 9 is a block diagram schematically showing a testing device 200 for a wafer and chips according to a sixth embodiment of the present invention. Mechanisms for alignment and compression bonding are identical to those of the testing device 100 according to the first embodiment. The sixth embodiment is different from the first embodiment in a heating mechanism. No heater 14 is employed but a thermostat 19 is provided in place thereof.

The thermostat 19 stores an upper bonding plate 11, a lower bonding plate 12 and a stage 30 with a semiconductor wafer 5 to be measured, to heat or cool the semiconductor wafer 5 for a burn-in test.

While the invention has been shown and described in detail, the foregoing description is in all aspects illustrative and not restrictive. It is therefore understood that numerous modifications and variations can be devised without departing from the scope of the invention.

What is claimed is:

1. A testing device for a wafer and chips for testing at least one chip being formed on one major surface of a semiconductor wafer, said testing device comprising:
    (a) a test plate having a contact electrode being arranged to be in mirror image relation to a prescribed one of bonding pads provided in each said chip, at least a part of said test plate having transparency in the direction of its thickness;
    (b) alignment means for recognizing said semiconductor wafer through said test plate and relatively moving said test plate with respect to said semiconductor wafer thereby making alignment;
    (c) compression bonding means for bringing said contact electrode into contact with said prescribed bonding pad with a uniform and constant pressure; and
    (d) signal application means for applying an electric signal to said chip from said contact electrode.

2. A testing device for a wafer and chips in accordance with claim 1, wherein said test plate comprises (a-1) a transparent substrate having said contact electrode on its surface.

3. A testing device for a wafer and chips in accordance with claim 2, wherein said substrate is substantially formed by a polyimide film.

4. A testing device for a wafer and chips in accordance with claim 2, wherein said test plate further comprises (a-2) an upper bonding plate being formed on an opposite side of said contact electrode through said substrate.

5. A testing device for a wafer and chips in accordance with claim 4, wherein said upper bonding plate is partially opened.

6. A testing device in accordance with claim 4, wherein at least a part of said upper bonding plate has transparency.

7. A testing device for a wafer and chips in accordance with claim 6, wherein said upper bonding plate is made of a material substantially having transparency.

8. A testing device for a wafer and chips in accordance with claim 6, wherein said alignment means comprises:
    (b-1) positional relation detection means for recognizing said semiconductor wafer through said test plate thereby detecting positional relation between said test plate and said semiconductor wafer, and
    (b-2) moving means for relatively moving said test plate with respect to said semiconductor wafer on the basis of said positional relation.

9. A testing device for a wafer and chips in accordance with claim 8, wherein said semiconductor wafer has a first alignment mark,
    said substrate having a second alignment mark coinciding with said first alignment mark under said part of said upper bonding plate having transparency.

10. A testing device for a wafer and chips in accordance with claim 6, wherein an organic film is in close contact with another major surface of said semiconductor wafer,
    said testing device further comprising a lower bonding plate for receiving said organic film of said semiconductor wafer.

11. A testing device for a wafer and chips in accordance with claim 10, wherein said chips are separated from each other.

12. A testing device for a wafer and chips in accordance with claim 11, wherein said at least one chip is single.

13. A testing device for a wafer and chips in accordance with claim 10, wherein said lower bonding plate comprises temperature control means on its upper major surface.

14. A testing device for a wafer and chips in accordance with claim 13, wherein said temperature control means is a heater.

15. A testing device for a wafer and chips in accordance with claim 10, further comprising a thermostat for storing said test plate and said semiconductor wafer.

16. A testing device for a wafer and chips in accordance with claim 15, wherein said thermostat further stores said upper bonding plate and said lower bonding plate.

17. A testing device for a wafer and chips in accordance with claim 1, wherein said contact electrode is made of a convex conductive material.

18. A testing device for a wafer and chips in accordance with claim 17, wherein said conductive material is a metal.

19. A testing device for a wafer and chips in accordance with claim 17, wherein said conductive material is prepared from an organic material containing a conductive material.

20. A testing device for a wafer and chips in accordance with claim 17, further comprising an anisotropic conductive film having flexibility, excellent conductivity in a direction of its thickness and no conductivity in a direction perpendicular to said direction of its thickness, said anisotropic conductive film being interposed between said contact electrode and said chip,
    said contact electrode being compression-bonded to said bonding pad being opposite thereto through said anisotropic conductive film to conduct with said bonding pad.

21. A testing device for a wafer and chips in accordance with claim 1, wherein said signal application means simultaneously applies prescribed said electric signal to all said chips from said contact electrode.

22. A testing device for a wafer and chips in accordance with claim 21, wherein said prescribed electric signal is a pulse signal required for driving said chips.

23. A testing &vice for a wafer and chips in accordance with claim 21, wherein said prescribed electric signal is a dc voltage.

24. A testing device for a wafer and chips for testing at least one chip being formed on one major surface of a semiconductor wafer, said testing device comprising:
 (a) a test plate including:
  (a-1) a substrate having:
   (a-1-1) a contact electrode being arranged to be in mirror image relation to a prescribed one of bonding pads provided in each said chip, and
   (a-1-2) a through hole passing through a portion close to said contact electrode, and
  (a-2) a wire being formed on a surface of said substrate being opposite to that provided with said contact electrode to be connected to said contact electrode via said through hole;
 (b) alignment means for relatively moving said test plate with respect to said semiconductor wafer thereby making alignment;
 (c) compression bonding means for bringing said contact electrode into contact with said prescribed bonding pad with a uniform and constant pressure; and
 (d) signal application means for applying an electric signal to said chip from said contact electrode.

25. A testing device for a wafer and chips for testing at least one chip being formed on one major surface of a semiconductor wafer, said testing device comprising:
 (a) a test plate having a contact electrode being arranged to be in mirror image relation to a prescribed one of bonding pads provided in each said chip;
 (b) alignment means for relatively moving said test plate with respect to said semiconductor wafer thereby making alignment;
 (c) compression bonding means including:
  (c-1) pressurization means for pressing said test plate,
  (c-2) detection means for detecting a current flowing to said contact electrode,
  (c-3) control means for controlling force of said pressurization means pressing said test plate depending on the result of detection by said detection means, and
  (c-4) a lower bonding plate for receiving said semiconductor wafer, said compression bonding means bringing said contact electrode into contact with said prescribed bonding pad with a uniform and constant pressure; and
 (d) signal application means for applying an electric signal to said chip from said contact electrode.

* * * * *